(12) United States Patent
Takahashi et al.

(10) Patent No.: US 8,305,102 B2
(45) Date of Patent: Nov. 6, 2012

(54) PROBE CARD, METHOD FOR MANUFACTURING PROBE CARD, AND PROBER APPARATUS

(75) Inventors: Yoshikazu Takahashi, Kanagawa (JP); Hiroshi Ban, Kanagawa (JP)

(73) Assignee: International Business Machines Corporation, Armonk, NY (US)

( * ) Notice: Subject to any disclaimer, the term of this patent is extended or adjusted under 35 U.S.C. 154(b) by 366 days.

(21) Appl. No.: 12/692,917

(22) Filed: Jan. 25, 2010

(65) Prior Publication Data

US 2010/0201390 A1   Aug. 12, 2010

(30) Foreign Application Priority Data

Feb. 26, 2009   (JP) .................................. 2009-44561

(51) Int. Cl.
 *G01R 31/00* (2006.01)
(52) U.S. Cl. ......... 324/755.04; 324/755.07; 324/755.06; 324/755.05
(58) Field of Classification Search ............. 324/755.04, 324/755.06, 755.07
See application file for complete search history.

(56) References Cited

U.S. PATENT DOCUMENTS

| | | | |
|---|---|---|---|
| 5,323,107 A * | 6/1994 | D'Souza | 324/750.3 |
| 7,063,541 B2 * | 6/2006 | Grube et al. | 439/66 |
| 7,368,929 B2 * | 5/2008 | Nayak et al. | 324/750.24 |
| 7,555,836 B2 * | 7/2009 | Mathieu et al. | 29/876 |
| 7,589,547 B2 * | 9/2009 | Ismail | 324/755.07 |
| 7,679,388 B2 * | 3/2010 | Chen et al. | 324/755.07 |
| 2007/0089551 A1 * | 4/2007 | Williams et al. | 73/866.5 |
| 2008/0074132 A1 * | 3/2008 | Fan et al. | 324/762 |
| 2008/0284458 A1 * | 11/2008 | Hosaka | 324/762 |

FOREIGN PATENT DOCUMENTS

| | | |
|---|---|---|
| JP | 5-011018 | 1/1993 |
| JP | 6-174746 | 6/1994 |
| JP | 09-133710 A | 5/1997 |
| JP | 2004-045285 | 2/2004 |
| JP | 2009-044561 A | 2/2009 |

* cited by examiner

*Primary Examiner* — Richard Isla Rodas
(74) *Attorney, Agent, or Firm* — Yuanmin Cai

(57) ABSTRACT

Embodiments of the present invention provide a probe card in which the positional shift of the tip of a probe can be compensated for in response to a change in the temperature, and a wafer test in a wide range of temperatures can be performed. More specifically, the probe card includes a substrate, a probe composed of a first metallic material having a first thermal expansion coefficient, a base of the probe being joined to the substrate, a tip of the probe coming into contact with a connection terminal of an electronic device, and a thermal compensation member composed of a second metallic material having a second thermal expansion coefficient that is higher than the first thermal expansion coefficient, a base of the thermal compensation member being fixed to the substrate, a tip of the thermal compensation member coming into contact with the probe at an intermediate portion between the base of the probe and the tip of the probe.

12 Claims, 11 Drawing Sheets

FIG. 8
(a)
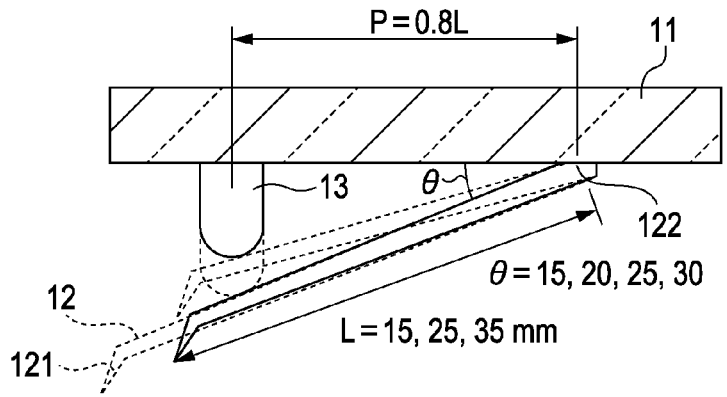
P = 0.8L
$\theta$ = 15, 20, 25, 30
L = 15, 25, 35 mm
(b)
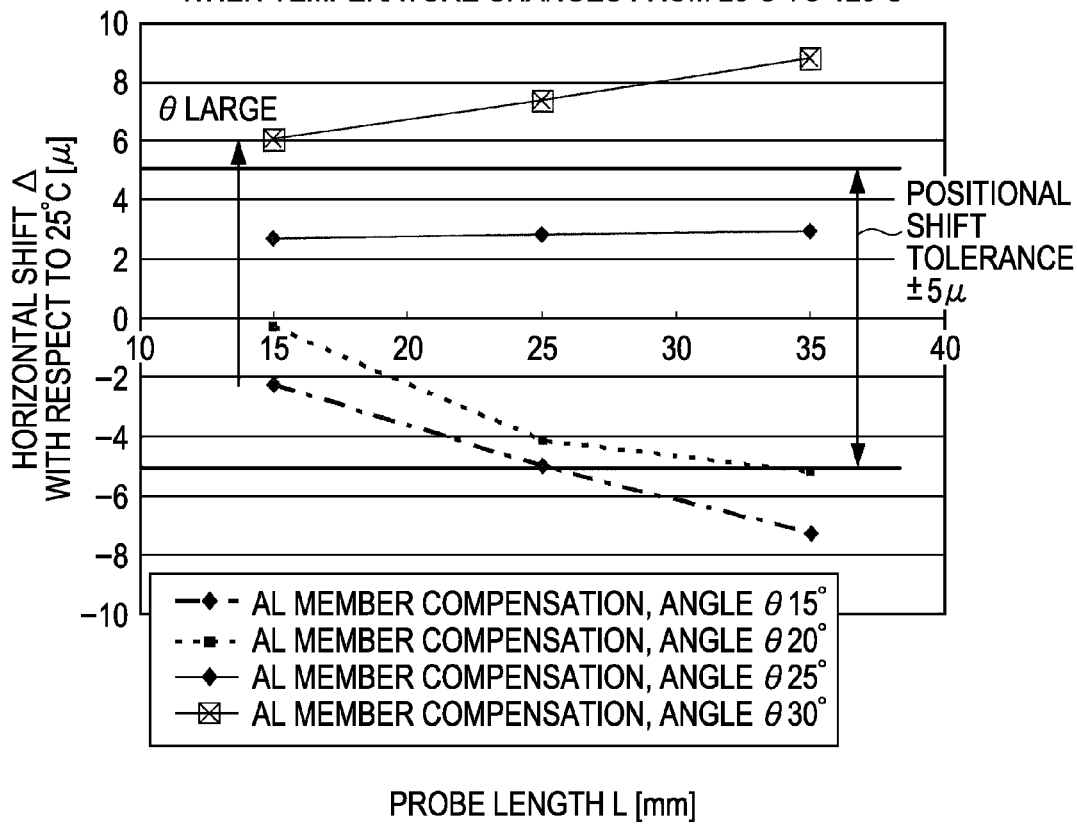

FIG. 9
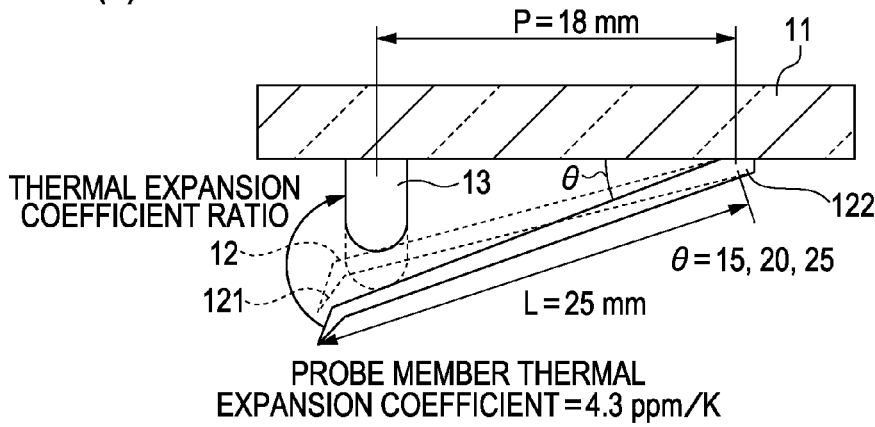
(a)
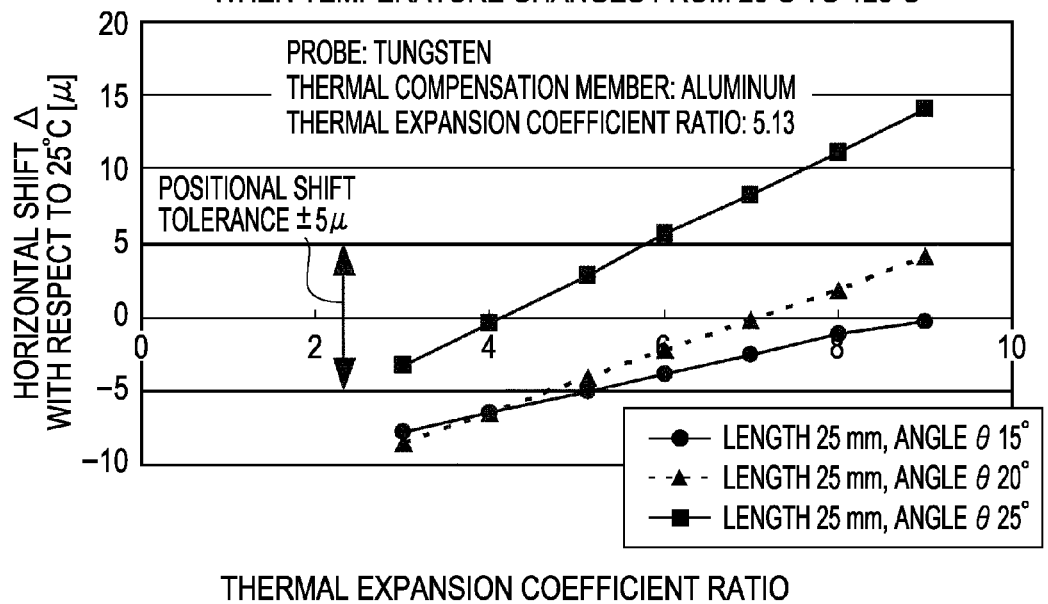
(b)

FIG. 10
(a)
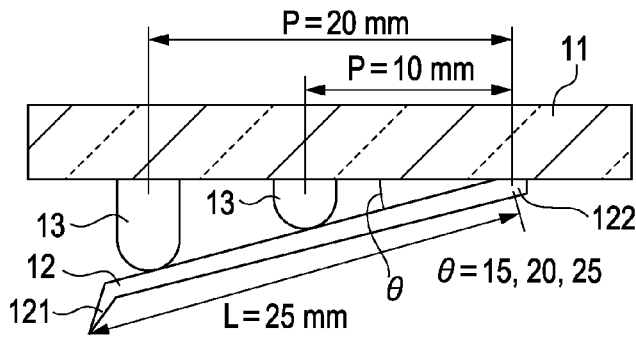
(b) POSITION P OF THERMAL COMPENSATION MEMBER AND HORIZONTAL SHIFT WHEN ALUMINUM MEMBER IS USED WHEN PROBE LENGTH L IS 25 mm AND TEMPERATURE CHANGES FROM 25°C TO 125°C
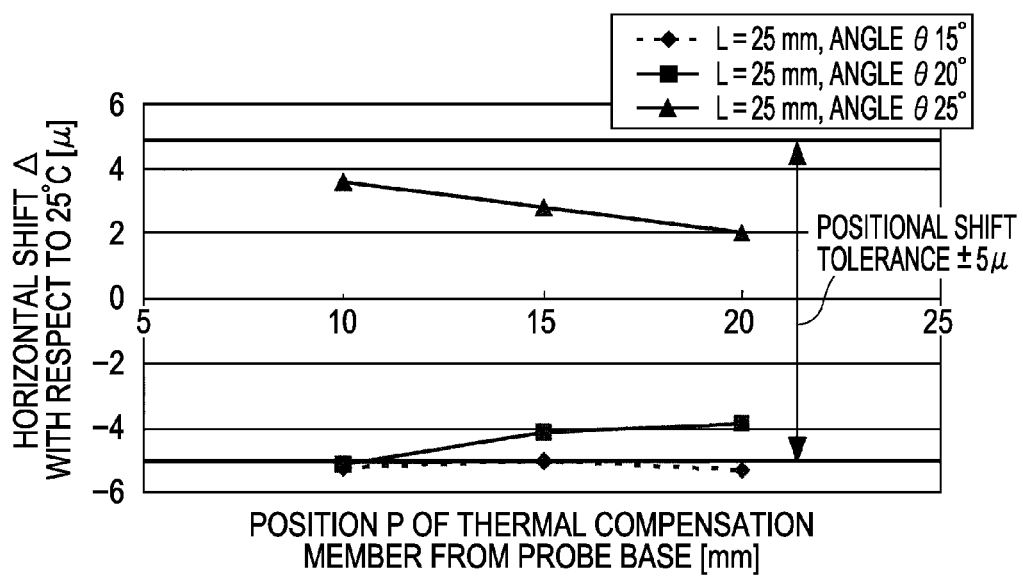
(c) STAGGERED ARRANGEMENT OF THERMAL COMPENSATION MEMBERS
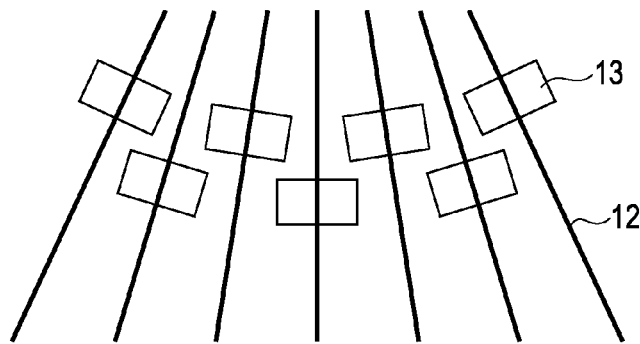

PROBE CARD, METHOD FOR MANUFACTURING PROBE CARD, AND PROBER APPARATUS

CROSS-REFERENCE TO RELATED APPLICATION

The present application claims the benefit of priority of a Japanese Patent Application No. 2009-44561, filed Feb. 26, 2009 with the Japan Patent Office, the content of which is incorporated herein by reference in its entirety.

FIELD OF THE INVENTION

The present invention relates to probe cards and the like, and in particular, relates to a probe card and the like to be used in a test apparatus testing a semiconductor chip.

BACKGROUND OF THE INVENTION

Hitherto, a test apparatus provided with a probe card including a plurality of probes has been used when testing an electronic device such as a semiconductor device. In this case, an electronic device is fixed on a probe station of the test apparatus, a probe of the probe card is brought close to the probe station, and the tip of the probe is brought into contact with a terminal of the electronic device to be tested. In general, in testing an electronic device, a test for resistance properties of the electronic device to temperature changes is performed. Thus, methods for maintaining a correct position of a probe are disclosed.

For example, Patent Document 1 (Japanese Unexamined Patent Application Publication No. 5-011018) describes a probe card. In the probe card, probes in each of which a curved portion is formed are fixed to a thin substrate, using insulating resin, and the probes are fixed by disposing a metal ring having a high thermal expansion coefficient inside the curved portions while insulating the probes by the use of insulating resin. In this arrangement, the probe card enables a heat test in a wide range of temperatures, using a single card, by changing the position of the tip of each of the probes in response to the temperature.

Moreover, Patent Document 2 (Japanese Unexamined Patent Application Publication No. 6-174746) describes a heat-resistant probe card. In the heat-resistant probe card, elastic members are set to intervene in a portion adhesively fixed between a probe card substrate to which the respective bases of probes are fixed and a fixing ring fixing the respective intermediate joints of the probes, and a flexible bending portion is provided between the base and intermediate joint of each of the probes. In this arrangement, when the heat-resistant probe card is used in a test mode with sharp temperature variations, the heat-resistant probe card prevents the positional shift of the tip of the probe due to a difference in the thermal expansion coefficient.

Moreover, Patent Document 3 (Japanese Unexamined Patent Application Publication No. 2004-045285) describes a probe card. The probe card includes a substrate, a plurality of probes coming into contact with a plurality of terminals of an electronic device, and a plurality of signal lines. At least one of the probes is a bimorph pin including a first member that has a first thermal expansion coefficient and is disposed obliquely with respect to a surface of a terminal of a corresponding electronic device and a second member that has a second thermal expansion coefficient that is lower than the first thermal expansion coefficient and is joined to the first member. In this arrangement, the probe card can maintain satisfactory contact with an electronic device.

In general, a probe card to be used in a semiconductor wafer test is designed and manufactured so that the tip of a probe is positioned to the center of a chip pad of a large-scale integrated circuit (LSI) at a specified temperature. A probe is composed of, for example, tungsten having a low thermal expansion coefficient (thermal expansion coefficient: 4.5 ppm/K). As the size of an LSI is decreased, the size of a pad is also decreased. Thus, a change in the position of a probe due to thermal expansion cannot be disregarded.

FIG. 11 is a diagram showing a change in the position of the tip of a known probe due to thermal expansion. A probe card 10a shown in FIG. 11(a) includes a substrate 11 and a probe 12a. The tip of the probe 12a is bended in a hook shape, and the base of the probe 12a is joined to the substrate 11 by the use of a solder 14. In general, a fixation portion 111 of the probe card 10a is fixed to a test apparatus called a prober (not shown) by the use of a screw cramp. Moreover, the probe 12a is fixed to the substrate 11 in the neighborhood of the base by the use of a support member 15 composed of, for example, an organic material such as epoxy resin.

When the probe 12a is composed of tungsten, the probe 12a is designed so that the probe 12a is positioned to the center of a bonding pad at 85° C., and the probe 12a is used at a temperature near this temperature. At this time, when the length of the probe 12a is 20 mm, in a case where the operating temperature increases by 100° C., the length of the probe 12a increases by about 11 µm due to thermal expansion. Thus, the tip of the probe 12a is shifted in the direction of an arrow C to be moved off the center of a bonding pad. Moreover, when the length of the probe is 30 mm, in a case where the operating temperature is 25° C., the probe shrinks by about 8 µm or more. Even in this case, the tip of the probe is moved off the center of a bonding pad.

In this manner, in situations in which the chip size is decreased, and the size of a bonding pad is also decreased, a probe expands or shrinks due to a change in the test temperature. Especially, when the tip of a probe is shifted in the horizontal direction, the following problems occur: For example, the tip of a probe damages the top surface of a bonding pad, or a problem occurs in bonding because a probe trace overlaps with a bonding position used in actual chip bonding. Thus, there is a problem with an existing probe card such that the position of the tip of a probe needs to be optimized for each test temperature.

BRIEF SUMMARY OF THE INVENTION

It is an object of the present invention to provide a probe card in which the positional shift of the tip of a probe can be compensated for in response to a change in the temperature, and a wafer test in a wide range of temperatures can be performed.

According to the present invention, a probe card to be used for testing an electronic device is provided. The probe card includes a substrate, a probe composed of a first metallic material having a first thermal expansion coefficient, a base of the probe being joined to the substrate, a tip of the probe coming into contact with a connection terminal of the electronic device, and a thermal compensation member composed of a second metallic material having a second thermal expansion coefficient that is higher than the first thermal expansion coefficient, a base of the thermal compensation member being fixed to the substrate, a tip of the thermal compensation member coming into contact with the probe at an intermediate portion between the base of the probe and the tip of the probe.

In this case, in the probe card, to which the present invention is applied, the thermal compensation member may undergo thermal expansion due to an increase in a temperature to push a position of the tip of the probe down and compensate for a positional shift of the probe in a horizontal direction due to thermal expansion.

Moreover, in the probe card, to which the present invention is applied, the second thermal expansion coefficient of the second metallic material is preferably three times or more as high as the first thermal expansion coefficient of the first metallic material.

Moreover, the second thermal expansion coefficient of the second metallic material is preferably less than a value that is ten times as high as the first thermal expansion coefficient of the first metallic material.

Moreover, a positional shift of the tip of the probe in a horizontal direction due to thermal expansion is preferably within ±5 µm.

Moreover, in the probe card, to which the present invention is applied, the tip of the thermal compensation member is preferably spherically shaped so that the probe comes into contact with the tip of the thermal compensation member as a tangent.

Moreover, the probe is preferably composed of tungsten, and the thermal compensation member is preferably composed of aluminum.

Moreover, the probe is preferably joined to the substrate to form an angle in a range of 15° to 30° with the substrate surface.

Moreover, the thermal compensation member and another thermal compensation member different from each other in a length between the base of the probe and the base of the thermal compensation member are preferably alternately disposed in a staggered arrangement.

According to the present invention, a method for manufacturing a probe card including a substrate and probes joined to the substrate is provided. The method includes an insulating step of insulating a metallic bar composed of a metallic material, a seal attachment step of attaching an adhesive seal to a surface of the metallic bar insulated in the insulating step, a cutting step of cutting the metallic bar, to which the adhesive seal is attached in the seal attachment step, into a plurality of metal pieces, with the adhesive seal being left, a metal piece fixing step of fixing the plurality of metal pieces cut in the cutting step on a substrate, and a probe joining step of joining probes to the substrate so that the probes come into contact with the metal pieces fixed on the substrate in the metal piece fixing step, the probes being composed of a metallic material having a thermal expansion coefficient that is a third or less of a thermal expansion coefficient of the metal pieces.

In this case, in the method for manufacturing a probe card, to which the present invention is applied, the metallic bar is preferably composed of aluminum.

Moreover, the adhesive seal is preferably a double-faced (or double-stick) tape.

Moreover, in the method for manufacturing a probe card, to which the present invention is applied, the plurality of metal pieces are preferably alternately fixed in a staggered arrangement by repeating the metal piece fixing step.

Moreover, according to the present invention, a prober apparatus for testing an electronic device is provided. The prober apparatus includes the aforementioned probe card, a stage for mounting a semiconductor wafer, and a drive moving the stage in XYZ directions.

In the probe card according to the present invention, the positional shift of the tip of a probe can be compensated for in response to a change in the temperature, and a wafer test in a wide range of temperatures can be performed.

In the method for manufacturing a probe card according to the present invention, a probe card in which a wafer test in a wide range of temperatures can be relatively readily performed can be obtained.

BRIEF DESCRIPTION OF THE DRAWINGS

FIG. 8 shows results of analyzing, by simulations, a length L of the probe, an angle θ at which the probe is joined, and a positional shift Δ of the tip of the probe when tungsten is used for the probe, and aluminum is used for a thermal compensation member.
FIG. 9 shows results of analyzing, by simulations, the ratio between the respective thermal expansion coefficients of the thermal compensation member and the probe and the positional shift Δ of the tip of the probe when the length L of the probe is set to 25 mm.
FIG. 10 shows results of analyzing, by simulations, the positional shift Δ of the tip of the probe due to a change in the length P between the base of the probe and a position to which the thermal compensation member is joined when the length L of the probe is set to 25 mm, and aluminum is used for the thermal compensation member.

DETAILED DESCRIPTION OF PREFERRED EMBODIMENTS

Embodiments for carrying out the present invention will now be described. The present invention is not limited to the following embodiment and may be modified in various forms within the spirit of the present invention. Moreover, the drawings to be used are used to describe the embodiment and do not reflect actual sizes.

Wafer Test Apparatus

Figure 1:
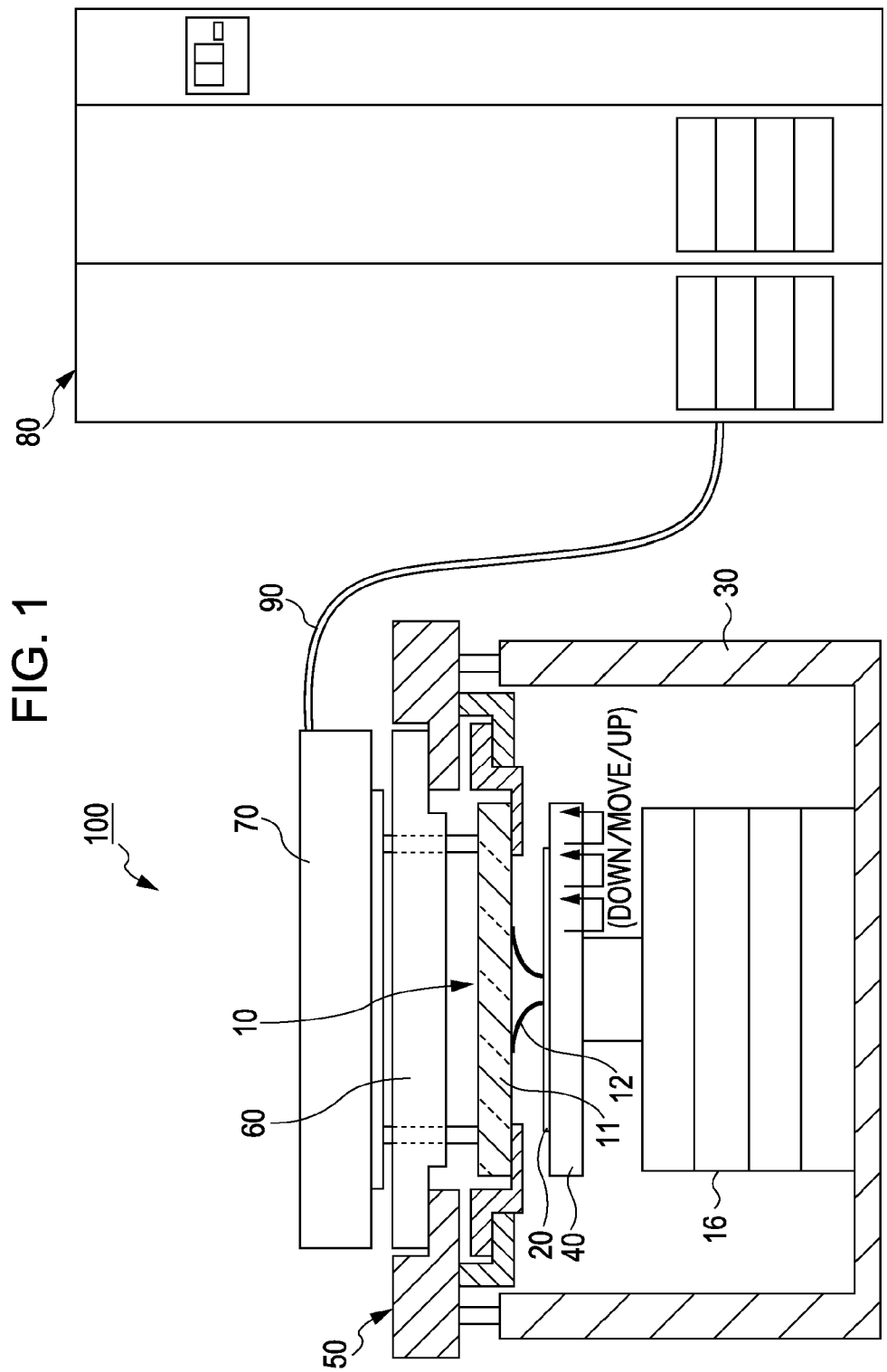
FIG. 1 is an outline block diagram of a wafer test apparatus.

FIG. 1 is an outline block diagram of a wafer test apparatus. A wafer test apparatus 100 shown in FIG. 1 includes a prober 30 to which a probe card 10 to be used in a wafer test is attached and a tester 80 to which test signals are sent from the prober 30 via a cable 90.

The prober 30 includes a stage 40 vacuum-sucking a wafer 20, a drive 16 moving the stage 40 in the XYZ directions, a fixing member 50 fixing the probe card 10 on the prober 30, and an interface 60 and a tester head 70 that supply test signals to the probe card 10. A substrate 11 of the probe card 10 is fixed by the fixing member 50, as shown in FIG. 1. Then, the respective tips of a plurality of probes 12 attached to the substrate 11 come into contact with the respective pads (connection terminals) of a plurality of chips (electronic devices; not shown) on the wafer 20.

The probe card 10 is electrically connected to the pads provided in the plurality of chips on the wafer 20 via the probes 12. Then, signals sent via the interface 60 and the tester head 70 are supplied to the chips. The probe card 10 further receives output signals output by the chips on the basis of the test signals. Then, the received output signals are supplied to the tester 80 via the interface 60 and the tester head 70. The tester 80 determines, on the basis of the output signals output by each of the chips, whether the chip is good or bad.

A wafer test is performed in several steps or stages. In the wafer test, the chips are moved by movement of the stage 40 in the XYZ directions under the probe card 10 in the following order: up, test, down, XY movement, and up. Moreover, the test temperature of the wafer 20 is set by a heater and a cooler built in the stage 40, and a high temperature or low temperature test is performed at the set test temperature.

During the wafer test, the temperature of each of the probes 12 reaches the set temperature of the stage 40, and the probe 12 expands or shrinks compared with the initial condition in response to a change in the temperature. Thus, the position of the tip of the probe 12 is shifted from the center of the pad of a corresponding one of the chips. For example, in a high temperature test at about 125° C., the position of the tip of the probe 12 moves down, as described below. In this case, the height of the stage 40 is decreased so as to compensate for a length which the position of the tip of the probe 12 moves down. Moreover, in a low temperature test at about 25° C., the position of the tip of the probe 12 moves up. In this case, the height of the stage 40 is increased so as to compensate for a length which the position of the tip of the probe 12 moves up.

Probe Card

Figure 2:
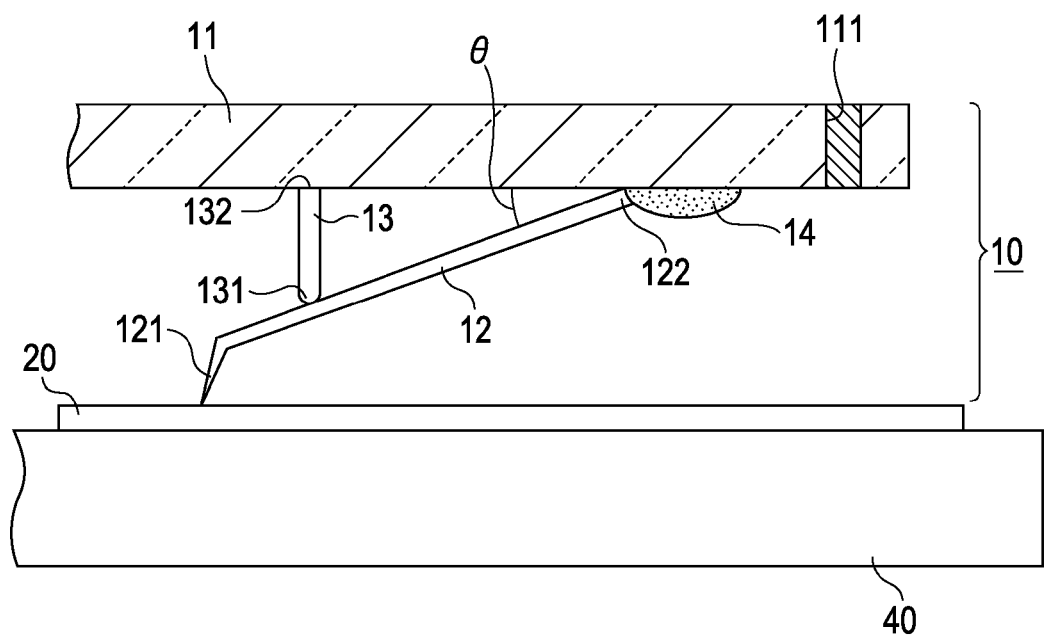
FIG. 2 is a diagram showing the structure of a probe card to which an embodiment is applied.

FIG. 2 is a diagram showing the structure of the probe card 10, to which the embodiment is applied. FIG. 2 shows the probe card 10 performing a test for the wafer 20 fixed on the stage 40 by vacuum suction.

The probe card 10 includes the substrate 11, a fixation portion 111 of the substrate 11 being fixed to the aforementioned prober 30 (refer to FIG. 1) by the use of a screw cramp, the probe 12, a base 122 of the probe 12 being joined to the substrate 11 by the use of a solder 14, a hook-shaped tip 121 of the probe 12 coming into contact with a connection terminal of a chip (not shown), and a thermal compensation member 13, a base 132 of the thermal compensation member 13 being fixed to the substrate 11, a tip 131 of the thermal compensation member 13 coming into contact with the probe 12 at an intermediate portion between the base 122 and tip 121 of the probe 12, as shown in FIG. 2.

The probe 12 is joined to the substrate 11 by the use of the solder 14 to form a predetermined angle θ with the substrate 11 and is electrically connected to a transmission line (not shown) provided in the substrate 11. The angle θ, which the probe 12 forms with the substrate 11 surface, is not limited to a specific angle. In the embodiment, an appropriate angle is selected from a range of 10° to 30°.

Materials composing the substrate 11 of the probe card 10 are not limited to specific materials and include, for example, glass epoxy, Teflon, and alumina. In the embodiment, glass epoxy is used. Moreover, for example, heat-resistant resin such as Teflon or alumina may be used.

The probe 12 is composed of a metallic material (a first metallic material) having a low thermal expansion coefficient (a first thermal expansion coefficient). A change due to expansion or shrinkage in the metallic material relative to a change in the test temperature at which a wafer test is performed is small. Specifically, a metallic material having a thermal expansion coefficient of 18 ppm/K or less, preferably 10 ppm/K or less, or more preferably 5 ppm/K or less is used.

When the thermal expansion coefficient of a metallic material composing the probe 12 is excessively high, the effect of a position compensation function may decrease.

Specific exemplary materials composing the probe 12 include, for example, tungsten, beryllium-copper alloy, tungsten-rhenium, and palladium alloy (Paliney 7, registered trademark). Among these materials, a tungsten-based material is preferable, and especially tungsten is preferable.

The length of the probe 12 is not limited to a specific length. In the embodiment, an appropriate length is selected from a range of 15 mm to 50 mm. In the embodiment, tungsten (thermal expansion coefficient: 4.5 ppm/K) is used for the probe 12. When the length of the probe 12 of tungsten is 20 mm, in a case where the test temperature increases by 100° C., a change in the length of the probe 12 due to thermal expansion is about 13.5 μm, as described above.

The thermal compensation member 13 is composed of a second metallic material having a second thermal expansion coefficient that is higher than the first thermal expansion coefficient of the first metallic material composing the aforementioned probe 12.

The relationship between the first thermal expansion coefficient and the second thermal expansion coefficient is not limited to a specific relationship. In the embodiment, the second thermal expansion coefficient needs to be usually three times or more, preferably four times or more, more preferably five times or more, or more preferably six times or more as high as the first thermal expansion coefficient.

Specifically, a metallic material having a thermal expansion coefficient of 18 ppm/K or more, preferably 23 ppm/K or more, or more preferably 28 ppm/K or more is used for the thermal compensation member 13. When the second thermal expansion coefficient is excessively low, the effect of the position compensation function may decrease.

Metallic materials composing the thermal compensation member 13 include, for example, aluminum (23 ppm/K), manganese (23 ppm/K), zinc (30.2 ppm/K), magnesium (25.4 ppm/K), tin (26.9 ppm/K), silicon (24 ppm/K), cadmium (28.8 ppm/K), and Duralumin (22.6 ppm/K). Among these materials, aluminum or tin is preferable, and especially aluminum is preferable. In the embodiment, the thermal compensation member 13 is composed of aluminum. Moreover, the thermal compensation member 13 is preferably an insulator. When aluminum is used for the thermal compensation member 13, aluminum oxide is preferably formed by oxidizing the surface of the thermal compensation member 13. Moreover, an insulating film may be formed on the surface of the thermal compensation member 13 by plating.

Moreover, in the embodiment, the thermal compensation member 13 is preferably composed of a metallic material having a Young's modulus of 1 GPa or more. The Young's modulus of a metallic material composing the thermal compensation member 13 is preferably 10 GPa or more, or more preferably 50 GPa or more.

When the Young's modulus of a metallic material composing the thermal compensation member 13 is excessively low, the effect of the position compensation function may decrease because the probe 12 sinks into the thermal compensation member 13.

The length of the thermal compensation member 13 is not limited to a specific length. In the embodiment, an appropriate length is selected from a range of 5 mm to 20 mm. In the embodiment, the tip 131 of the thermal compensation member 13 in contact with the probe 12 is spherically shaped, as shown in FIG. 2. Since the tip 131 is spherically shaped, unnecessary stress concentration does not occur in the tip 131.

Moreover, the base 132 of the thermal compensation member 13 is fixed to the substrate 11 by the use of, for example, an adhesive. The position on the substrate 11 where the base 132 is fixed is not limited to a specific position, and an appropriate position is selected so that the tip 131 of the thermal compensation member 13 comes into contact with the probe 12 at an intermediate portion between the base 122 and tip 121 of the probe 12.

High Temperature Test

Figure 3:
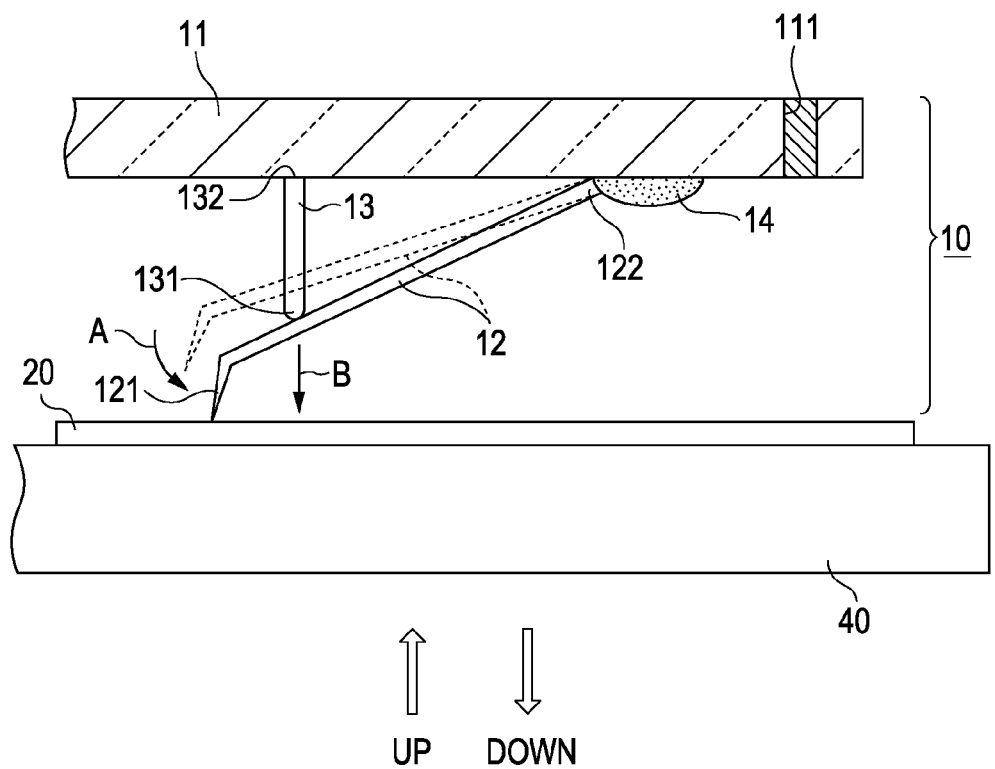
FIG. 3 is a diagram showing the probe card in a case where a wafer test is performed at a high temperature.

FIG. 3 is a diagram showing the probe card 10 in a case where a wafer test is performed at a high temperature. The same reference numerals are used for the same components as in FIG. 2, and the description of the components is omitted.

When the test temperature of the wafer 20 is a high temperature of about 125° C., the length of the thermal compensation member 13 increases due to thermal expansion, as shown in FIG. 3. At this time, the tip 131 of the thermal compensation member 13 pushes the probe 12 down (the direction of an arrow B), with the base 132 fixed to the substrate 11 being the supporting point. Thus, the tip 121 of the probe 12 is pushed down (the direction of an arrow A), with the base 122 being the supporting point, to be brought into contact with a connection terminal of a chip (not shown) on the wafer 20.

At this time, the stage 40 is moved down to compensate for a length which the position of the tip of the probe 12 is moved down in units of, for example, 1 μm. A length which the position of the tip of the probe 12 is moved down is set in advance on the basis of the thermal expansion coefficient (the second thermal expansion coefficient) of a metallic material (the second metallic material) used for the thermal compensation member 13. Moreover, the position of the tip of the probe 12 is moved up in a low temperature test at about 25° C. In this case, the stage 40 is moved up to compensate for a length which the position of the tip of the probe 12 is moved up.

In the embodiment, the probe 12 is composed of a metallic material (the first metallic material) having a low thermal expansion coefficient (the first thermal expansion coefficient). On the other hand, the thermal compensation member 13 is composed of a metallic material (the second metallic material) having a thermal expansion coefficient that is higher than (for example, three times or more: the second thermal expansion coefficient) the first thermal expansion coefficient. Thus, in a high temperature test, the tip 131 pushes the probe 12 down (the direction of the arrow B) due to thermal expansion of the thermal compensation member 13 to compensate for the positional shift (or alignment error) of the tip 121 in the horizontal direction due to thermal expansion of the probe 12.

Figure 4:
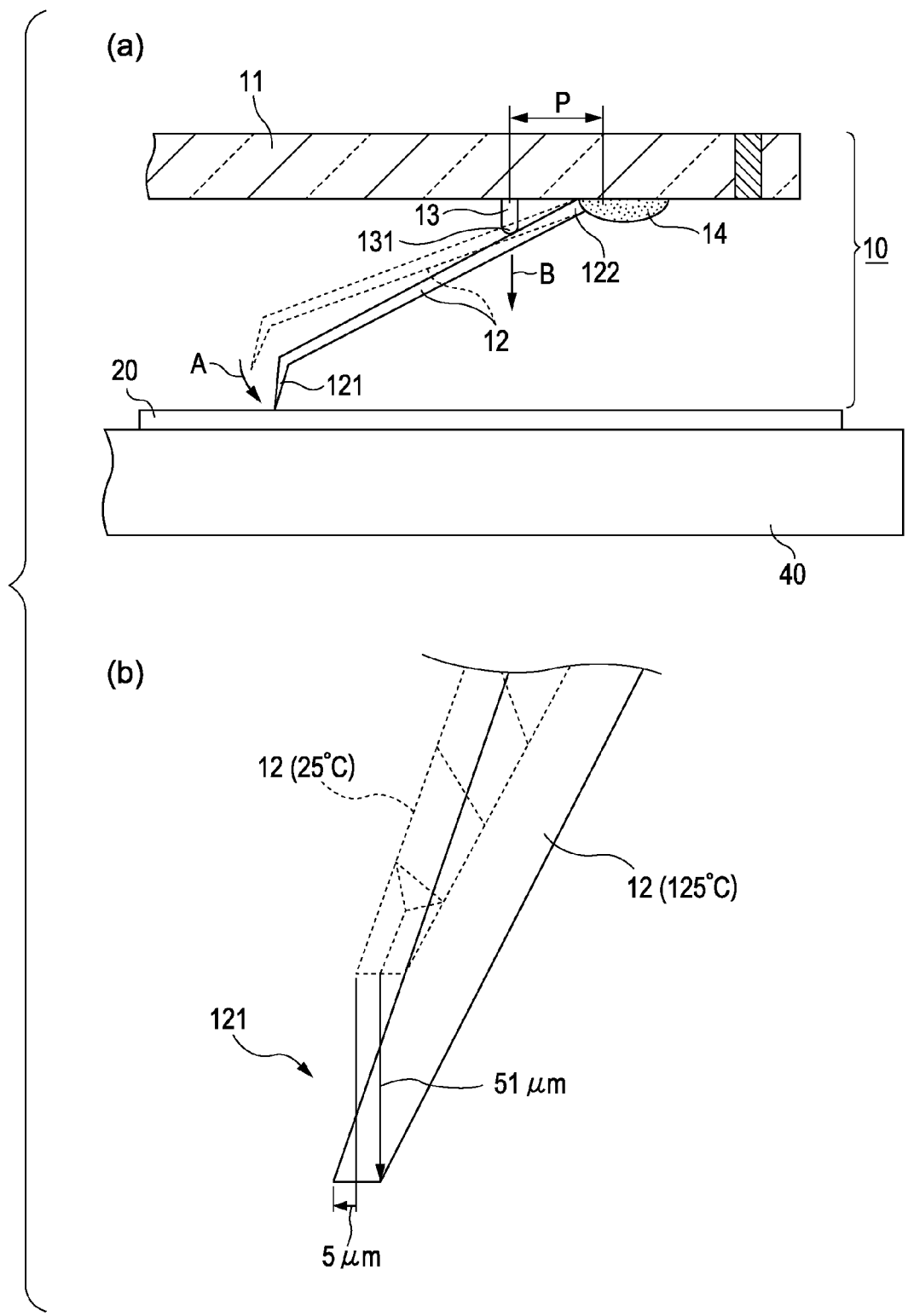
FIG. 4 is a diagram showing a change in the position of the tip of a probe in a high temperature test.

FIG. 4 is a diagram showing a change in the position of the tip of the probe 12 in a high temperature test. In the probe card 10 shown in FIG. 4(a), the thermal compensation member 13 of aluminum is fixed in the neighborhood of the base 122 of the probe 12. In the embodiment, a length P between the position of the base 122 of the probe 12 and a position to which the thermal compensation member 13 is fixed is 18 mm. Moreover, in the embodiment, the probe 12 is composed of tungsten, has a length of 30 mm, and is joined to the substrate 11 by the use of the solder 14 to form an angle (θ) of 15° with the substrate 11.

When the thermal compensation member 13 is fixed in the neighborhood of the base 122 of the probe 12, as shown in FIG. 4(a), the tip 121 of the probe 12 is pushed down (the direction of the arrow A) a large length by a slight increase in the length of the thermal compensation member 13 undergoing thermal expansion in the direction of the arrow B.

FIG. 4(b) shows results of obtaining positions of the tip 121 at different temperatures by simulations. Test temperatures in a wafer test are 25° C. (broken lines in FIG. 4(b)) and 125° C. (solid lines in FIG. 4(b)). FIG. 4(b) shows that, when the test temperature increases from 25° C. to 125° C., as compared with the case of 25° C., the position of the tip 121 is moved down a large length of about 51 μm, and in contrast, the positional shift in the horizontal direction is about 5 μm. When the positional shift in the horizontal direction is about 5 μm, the wafer test can be performed, regarding the positional shift as a tolerable shift.

Figure 11:
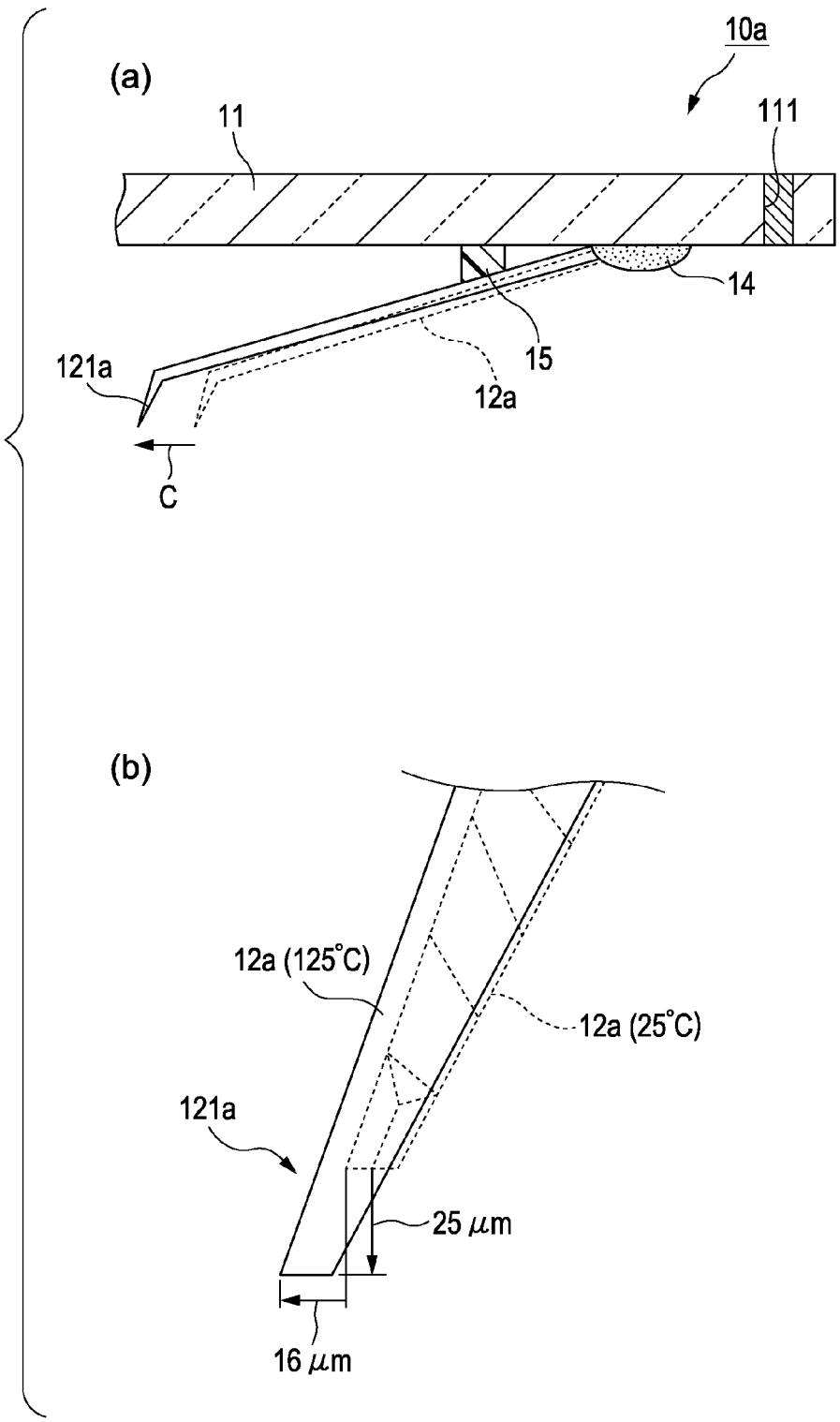
FIG. 11 is a diagram showing a change in the position of the tip of a known probe due to thermal expansion.

On the other hand, FIG. 11(b) shows results of obtaining positions of a tip 121a of the known probe 12a at different temperatures by simulations. Test temperatures in a wafer test are 25° C. (broken lines in FIG. 11(b)) and 125° C. (solid lines in FIG. 11(b)). The probe 12a has a length of 30 mm and is joined to the substrate 11 by the use of the solder 14 to form an angle (θ) of 15° with the substrate 11, as in the case of FIG. 4(a) described above. Moreover, the probe 12a is fixed to the substrate 11 in the neighborhood of the base by the use of the support member 15 (refer to FIG. 11(a)) composed of, for example, an organic material such as epoxy resin.

FIG. 11(b) shows that, when the test temperature increases from 25° C. to 125° C., as compared with the case of 25° C., the positional shift of the tip 121a in the downward direction is about 25 μm, and in contrast, the positional shift in the horizontal direction is a large shift of about 16 μm. When the positional shift of the tip 121a in the horizontal direction reaches about 16 μm, the positional shift is out of tolerance, and thus the wafer test cannot be performed.

A method for manufacturing a probe card will next be described.

Figure 5:
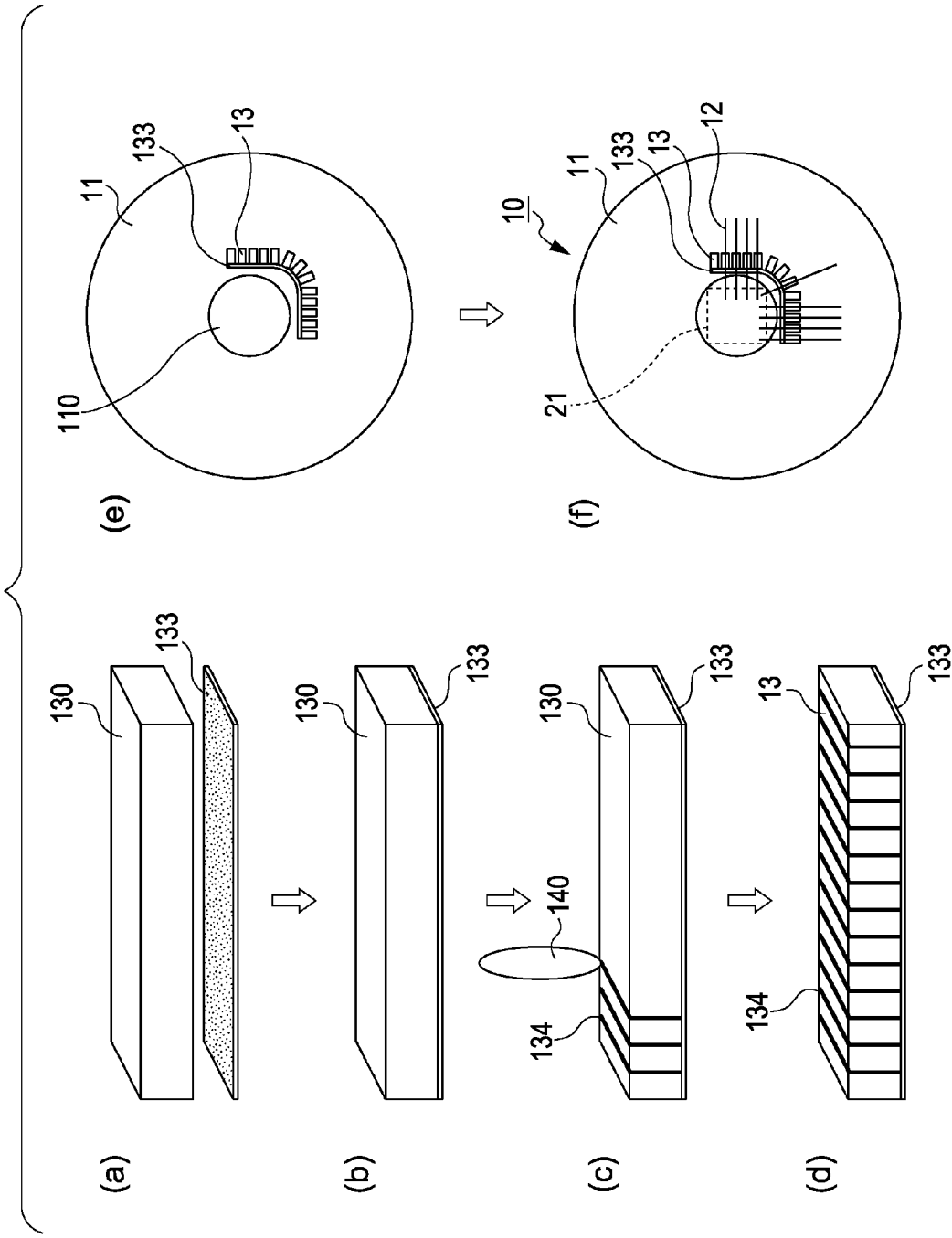
FIG. 5 is a diagram showing an exemplary method for manufacturing the probe card.

FIG. 5 is a diagram showing an exemplary method for manufacturing the probe card 10. A metallic bar 130 constituting the thermal compensation member 13 (refer to FIG. 2) is first prepared, as shown in FIG. 5(a). The metallic bar 130 is composed of a metallic material having a thermal expansion coefficient of 20 ppm/K or more. After the metallic bar 130 is insulated, an adhesive seal 133 is attached to the metallic bar 130 to prepare the metallic bar 130, to a surface of which the adhesive seal 133 is attached, as shown in FIG. 5(b). For example, a double-faced adhesive seal is preferred as the adhesive seal 133.

Then, cuts 134 are made in the metallic bar 130 at predetermined intervals, using a dicing cutter 140, as shown in FIG. 5(c), to obtain a plurality of thermal compensation members (metal pieces) 13 with a predetermined width cut at the cuts 134, with the adhesive seal 133 attached to the surface being left, as shown in FIG. 5(d). At this time, in addition, the plurality of cut thermal compensation members 13 may be processed so that a surface of each of the thermal compensation members 13 is spherically shaped.

Then, the plurality of thermal compensation members 13 are disposed around a central part 110 of the substrate 11 so that the respective surfaces of the thermal compensation members 13 to which the adhesive seal 133 is attached face the central part 110, as shown in FIG. 5(e). Then, the plurality of thermal compensation members 13 are temporarily tacked to the substrate 11 by the use of a chip (edge) of the adhesive seal 133 and are further fixed to the substrate 11 by the use of another adhesive. Finally, the probe card 10 is obtained by joining the probes 12 to the substrate 11 so that the probes 12 come into contact with the plurality of thermal compensation members 13 fixed to the substrate 11 and connection terminals of a chip 21, as shown in FIG. 5(f). It is preferable that the probes 12 be joined to the substrate 11 by soldering. In the embodiment, the thermal expansion coefficient of a metallic material composing the probe 12 is preferably a third or less of the thermal expansion coefficient of a metallic material composing the thermal compensation member 13.

Figure 6:
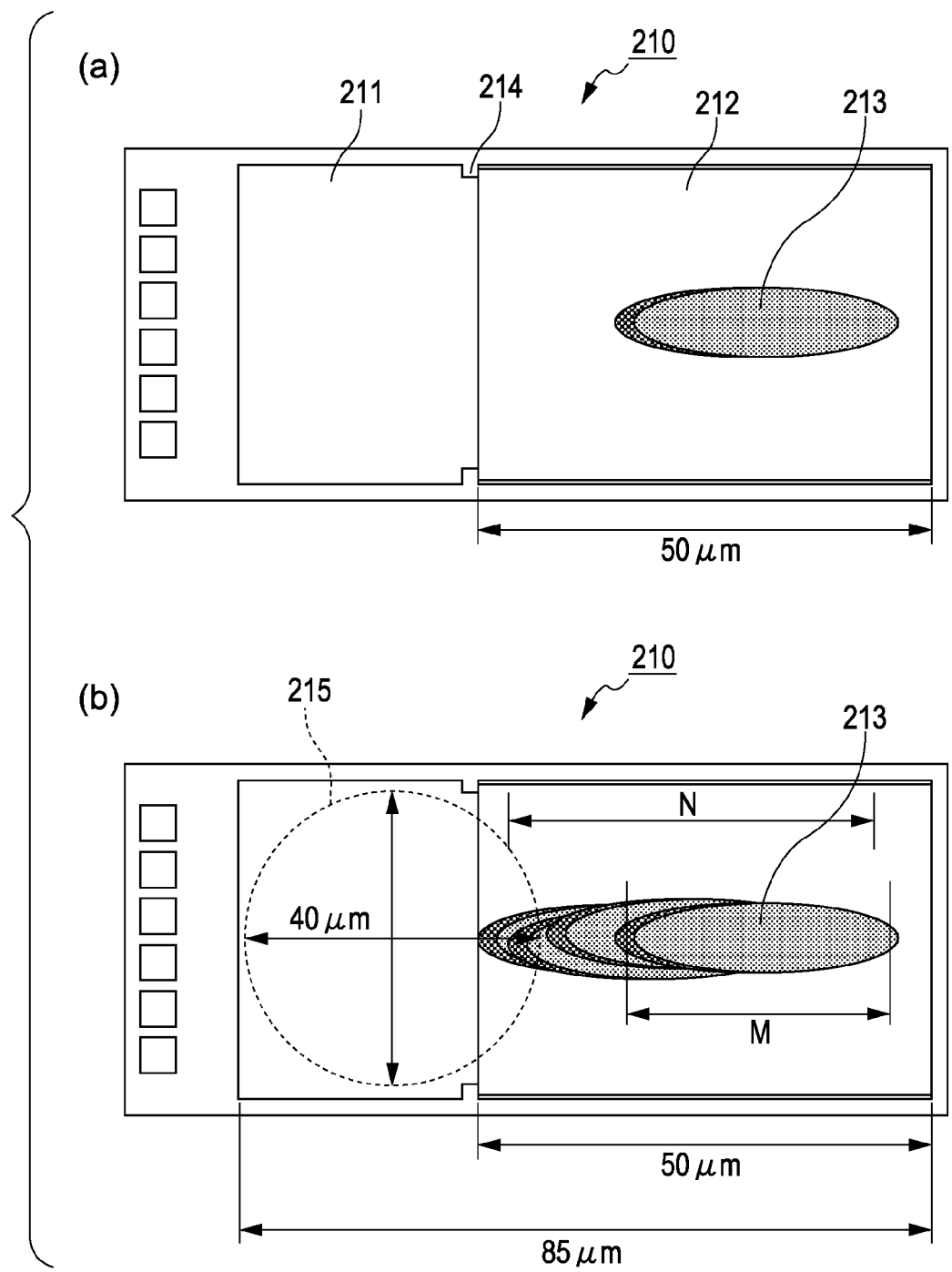
FIG. 6 is a diagram showing the state of a bonding pad and a probe trace.

FIG. 6 is a diagram showing the state of a bonding pad and a probe trace.

A bonding pad 210 includes a bonding space 211 to which a gold wire (not shown) is joined and a probing space 212 with which the tip of the probe 12 (not shown) of the probe card 10 comes into contact in a wafer test, as shown in FIG. 6(a). A 50-μm-notch 214 is formed at the boundary between the bonding space 211 and the probing space 212. A probe trace 213 produced by contact with the tip of the probe 12 is shown at a central part of the probing space 212.

In the embodiment, the length of the probing space 212 is 50 μm indicating the tolerance of the probe trace 213.

FIG. 6(b) is a diagram showing the tolerance of the probe trace 213 on the bonding pad 210 and the tolerance of the positional shift of the tip of a probe due to the test temperature obtained from the probe trace 213. In the embodiment, the total length of the bonding space 211 and the probing space 212 is 85 μm, as shown in FIG. 6(b). A circle 215 with a diameter of 40 μm shown in the bonding space 211 indicates a bonding portion of a bonding wire. The tolerance of the probe trace 213 is 50 μm, as described above.

In the embodiment, it is assumed that the accuracy of contact of the probe 12 coming into contact with the probing space 212 is about ±5 μm, and a shift of up to about 10 μm occurs in a wafer test. Moreover, a diameter M of the probe trace 213 is considered to be up to about 30 μm, considering the scrub of the probe 12 when the probe 12 comes into contact with the probing space 212.

In this case, it is clear that, when a target width N, on the probing space 212, of the position of the tip of the probe 12 coming into contact with the probing space 212 is set to 40 μm, considering an allowance of about 10 μm, the tolerance of the positional shift of the tip of a probe due to the test temperature needs to be maintained at up to about 5 μm (40 μm−30 μm−5 μm=5 μm).

Figure 7:
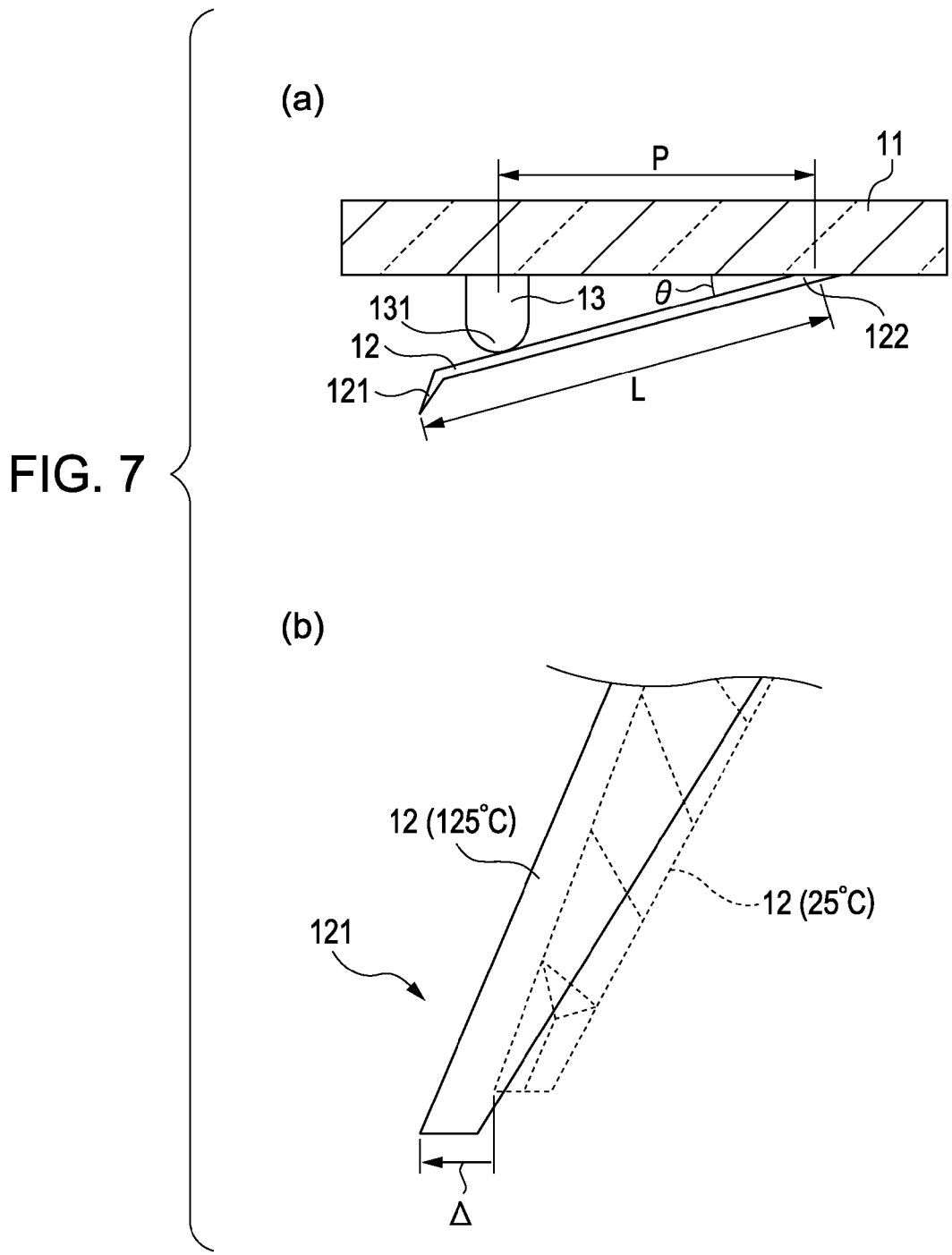
FIG. 7 is a diagram showing a simulation model of the probe card.

FIG. 7 is a diagram showing a simulation model of the probe card 10.

The base 122 of the probe 12 with a length L is joined to the substrate 11 to form a predetermined angle θ with the substrate 11, as shown in FIG. 7(a). In the embodiment, the probe 12 is composed of tungsten (the first metallic material). The thermal expansion coefficient (the first thermal expansion coefficient) of tungsten is 4.5 ppm/K.

The thermal compensation member 13 is fixed to the substrate 11 at a position distant, by a length P, from a position where the base 122 of the probe 12 is joined to the substrate 11, and the tip 131 of the thermal compensation member 13 comes into contact with the probe 12. Moreover, the thermal compensation member 13 is composed of a metallic material (the second metallic material) having a thermal expansion coefficient (the second thermal expansion coefficient) that is X times as high as the thermal expansion coefficient (the first thermal expansion coefficient: 4.5 ppm/K) of tungsten (the first metallic material) composing the probe 12. In this case, the tip 131 of the thermal compensation member 13 is spherically shaped.

FIG. 7(b) shows a positional shift Δ of the tip 121 of the probe 12 due to thermal expansion at a test temperature of 25° C. (a broken-line portion in FIG. 7(b)) and a test temperature of 125° C. (a solid-line portion in FIG. 7(b)). In FIG. 7(b), the simulation model of the probe card 10 shown in FIG. 7(a) is used, and the length L of the probe 12, the angle θ, at which the probe 12 is attached to the substrate 11, the length P to reach a position to which the thermal compensation member 13 is fixed, and the factor X to be multiplied by the first thermal expansion coefficient to obtain the second thermal expansion coefficient are changed.

Results of Simulations

The results of performing simulations in FIG. 7 and analyzing the scope of the present invention will next be described. In the simulations, the probe length L, the probe angle θ, the length P between the thermal compensation member 13 and the base 122 of the probe 12, and the ratio between the thermal expansion coefficient of the probe 12 and the thermal expansion coefficient of the thermal compensation member 13 are changed.

FIG. 8 shows results of analyzing, by simulations, the length L of the probe 12, the angle θ, at which the probe 12 is joined to the substrate 11, and the positional shift Δ of the tip 121 of the probe 12 when tungsten is used for the probe 12, and aluminum is used for the thermal compensation member 13.

The length P between the base 122 of the probe 12 and a position to which the thermal compensation member 13 is joined is set to be 0.8 times as long as the length L of the probe 12, as shown in FIG. 8(a). The angle θ, at which the probe 12 is joined to the substrate 11, is set to 15°, 20°, 25°, and 30°. The length L of the probe 12 is set to 15 mm, 25 mm, and 35 mm.

The result of the analysis shown in FIG. 8 (b) shows that, when the angle θ is 25°, the positional shift Δ is maintained constant regardless of the length L of the probe 12, so that the positional shift tolerance (±5 μm) is satisfied. Moreover, the result of the analysis shows that, when the angle θ is less than 25°, the length of the probe 12 satisfying the tolerance is short.

FIG. 9 shows results of analyzing, by simulations, the ratio between the respective thermal expansion coefficients of the thermal compensation member 13 and the probe 12 and the positional shift Δ of the tip 121 of the probe 12 when the length L of the probe 12 is set to 25 mm.

The angle θ, at which the probe 12 is joined to the substrate 11, is set to 15°, 20°, and 25°, as shown in FIG. 9(a). The length P between the base 122 of the probe 12 and a position to which the thermal compensation member 13 is joined is set to 18 mm.

The ratio between the thermal expansion coefficients when tungsten (a thermal expansion coefficient of 4.3 ppm/K) is used for the probe 12, and aluminum is used for the thermal compensation member 13 is 5.13, as shown in FIG. 9(b). In this case, it is clear that the positional shift tolerance (±5 μm) is satisfied when the angle θ, at which the probe 12 is joined to the substrate 11, falls within a range of 15° to 25°. This result shows that the combination of tungsten and aluminum is a practical and optimum choice.

FIG. 10 shows results of analyzing, by simulations, the positional shift Δ of the tip 121 of the probe 12 due to a change in the length P between the base 122 of the probe 12 and a position to which the thermal compensation member 13 is joined when the length L of the probe 12 is set to 25 mm, and aluminum is used for the thermal compensation member 13.

The angle θ, at which the probe 12 is joined to the substrate 11, is set to 15°, 20°, and 25°, as shown in FIG. 10(a). The length P between the base 122 of the probe 12 and a position to which the thermal compensation member 13 is joined is set to 10 mm and 20 mm.

When the length P between the base 122 of the probe 12 and a position to which the thermal compensation member 13 is joined is 10 mm, the positional shift Δ of the tip 121 of the probe 12 is 1.5 μm or less, as shown in FIG. 10(b). Thus, it is clear that, when the height of the thermal compensation member 13 is set so that the angle θ, at which the probe 12 is joined to the substrate 11, is constant, the thermal compensation member 13 can be provided as far as, for example, the length P reaches 10 mm.

This result shows that, for example, the two adjacent probes 12 different from each other in the length P between the base 122 of the probe 12 and a position to which the thermal compensation member 13 is joined can be alternately disposed so that the probes 12 do not overlap with each other, as shown in FIG. 10(c). In this arrangement, the thermal compensation members 13 are disposed in a staggered arrangement (or stagger patterned position). As a result, a larger number of the probes 12 can be disposed in the same area, and probe density can be increased.

Reference numerals in the drawings denote followings: 10: probe card, 11: substrate, 12: probe, 13: thermal compensation member, 20: wafer, 30: prober, 40: stage, 50: fixing member, 60: interface, 70: tester head, 80: tester, 90: cable, 100: wafer test apparatus

What is claimed is:

1. A probe card for testing an electronic device, the probe card comprising:
    a substrate;
    a probe composed of a first metallic material having a first thermal expansion coefficient, a base of the probe being joined directly to the substrate; and
    a thermal compensation member composed of a second metallic material having a second thermal expansion coefficient that is higher than the first thermal expansion coefficient, a base of the thermal compensation member being fixed to the substrate, a tip of the thermal compensation member being spherically shaped and coming into contact with the probe as a tangent of the spherical shape at an intermediate portion between the base of the probe and a tip of the probe; wherein a positional shift of the tip of the probe in a horizontal direction due to a temperature change during testing is caused to be within ±5 micrometers by a change of length of the thermal compensation member pushing on the probe.

2. The probe card according to claim 1, wherein the thermal compensation member undergoes thermal expansion due to an increase in a temperature to push a position of the tip of the probe down and compensate for a positional shift of the probe in a horizontal direction due to thermal expansion.

3. The probe card according to claim 1, wherein the second thermal expansion coefficient of the second metallic material is three times or more as high as the first thermal expansion coefficient of the first metallic material.

4. The probe card according to claim 3, wherein the second thermal expansion coefficient of the second metallic material is less than a value that is ten times as high as the first thermal expansion coefficient of the first metallic material.

5. The probe card according to claim 1, wherein the positional shift of the tip of the probe in a horizontal direction is caused by a temperature change from 25 degrees C. to 125 degrees C.

6. The probe card according to claim 1, wherein the probe is composed of tungsten, and the thermal compensation member is composed of aluminum plated with an insulating film.

7. The probe card according to claim 1, wherein the probe is joined to the substrate to form an angle in a range of 15° to 30° with the substrate surface.

8. The probe card according to claim 1, wherein the probe is a first probe and the thermal compensation member is a first thermal compensation member, further comprising a second probe and a second thermal compensation member in contact with and corresponding to the second probe, wherein the first thermal compensation member and the second thermal compensation member having different lengths and the bases of the first and second thermal compensation members are alternately disposed in a staggered arrangement.

9. A prober apparatus for testing an electronic device comprising:
    a probe card which comprises:
        a substrate;
        a probe composed of a first metallic material having a first thermal expansion coefficient, a base of the probe being joined directly to the substrate, a tip of the probe to be in contact with a connection terminal of the electronic device during testing; and
        a thermal compensation member composed of a second metallic material having a second thermal expansion coefficient that is higher than the first thermal expansion coefficient, a base of the thermal compensation member being fixed to the substrate, a tip of the thermal compensation member coming into contact with the probe at an intermediate portion between the base of the probe and the tip of the probe, and the thermal compensation member being plated on a surface thereof with an insulating film;
    a stage for mounting a semiconductor wafer, said wafer containing the electronic device; and
    a drive moving the stage in XYZ directions; wherein a positional shift of the tip of the probe in a horizontal direction due to a temperature change during testing is caused to be within ±5 micrometers by a change of length of the thermal compensation member pushing on the probe.

10. A probe card comprising:
    a substrate;
    a probe composed of a first metallic material having a first thermal expansion coefficient, a base of the probe being joined directly to the substrate; and
    a thermal compensation member composed of a second metallic material having a second thermal expansion coefficient that is higher than the first thermal expansion coefficient, a base of the thermal compensation member being fixed to the substrate, a tip of the thermal compensation member in contact with the probe at an intermediate point between the base of the probe and a tip of the probe,
    wherein the tip of the probe has a first horizontal position at a first temperature, and a second horizontal position at a second temperature that is at least 100 degree C. above the first temperature, the second horizontal position being caused to deviate less than 10 micrometers from the first horizontal position by the thermal compensation member pushing down the probe in compensating a length change of the probe.

11. The probe card according to claim 10, wherein the tip of the thermal compensation member is spherically shaped so that the probe comes into contact with the tip of the thermal compensation member as a tangent.

12. The probe card according to claim 10, wherein the probe is composed of tungsten, and the thermal compensation member is composed of aluminum plated with an insulating film.

* * * * *